United States Patent [19]

Schnurmann

[11] 4,348,759
[45] Sep. 7, 1982

[54] AUTOMATIC TESTING OF COMPLEX SEMICONDUCTOR COMPONENTS WITH TEST EQUIPMENT HAVING LESS CHANNELS THAN THOSE REQUIRED BY THE COMPONENT UNDER TEST

[75] Inventor: Henri D. Schnurmann, Monsey, N.Y.

[73] Assignee: International Business Machines Corporation, Armonk, N.Y.

[21] Appl. No.: 104,481

[22] Filed: Dec. 17, 1979

[51] Int. Cl.³ .................. G06F 11/12; G01R 15/12
[52] U.S. Cl. ............................. 371/20; 324/73 AT
[58] Field of Search ........ 371/20; 324/73 AT, 73 PC; 364/200, 900

[56] References Cited

U.S. PATENT DOCUMENTS

| | | | |
|---|---|---|---|
| 3,848,188 | 11/1974 | Ardezzone | 324/73 AT |
| 3,927,371 | 6/1975 | Pomeranz et al. | 324/73 R |
| 3,976,940 | 8/1976 | Chau et al. | 371/20 X |
| 4,023,097 | 5/1977 | Hanashey | 324/73 R |
| 4,034,287 | 7/1977 | Manduley et al. | 324/73 R |
| 4,044,244 | 8/1977 | Foreman et al. | 371/20 |
| 4,044,244 | 8/1977 | Foreman et al. | 235/153 |
| 4,055,801 | 10/1977 | Pike et al. | 324/73 AT X |
| 4,070,565 | 1/1978 | Borrelli | 371/20 |
| 4,092,589 | 5/1978 | Chau et al. | 371/20 X |
| 4,097,797 | 6/1978 | Finet | 324/73 R |
| 4,155,118 | 5/1979 | Lamiaux | 364/200 |
| 4,195,258 | 3/1980 | Yen | 324/73 AT |

FOREIGN PATENT DOCUMENTS 2020439 11/1979 United Kingdom .

Primary Examiner—David H. Malzahn
Attorney, Agent, or Firm—Wesley DeBruin

[57] ABSTRACT

A method and apparatus for testing large or very large scale integrated circuit packages is described. The testing equipment required for testing such packages is assumed to lack the number of channels necessary to connect one channel to each input/output of the unit under test. A computer program classifies all input terminals in a plurality of categories, each of which corresponds to particular circuit type and electric network configuration connected to that pin. A unique set of DC levels is defined prior to testing for each class of inputs. These levels are supplied by the tester channels, each of which drives a multitude of input pins that belong to the same category. The assignment of tester channels in the aforementioned arrangement is implemented by means of multiplexers that select for each pin the appropriate set of DC levels, and a memory buffer contained in the tester, with the DC test patterns stored wherein. The bit configuration of each pattern controls plural switching devices that deliver the appropriate DC levels to the terminals of the unit.

5 Claims, 6 Drawing Figures

AUTOMATIC TESTING OF COMPLEX SEMICONDUCTOR COMPONENTS WITH TEST EQUIPMENT HAVING LESS CHANNELS THAN THOSE REQUIRED BY THE COMPONENT UNDER TEST

BACKGROUND OF THE INVENTION

1. Field of the Invention

The present invention relates to a method and apparatus for testing electrical circuit units having a plurality of terminals or pins on a tester that lacks the number of necessary channels to connect one circuit pin to one tester channel. More particularly, this invention relates to the utilization of a tester in which the terminals of an integrated circuit unit under test exceeds by a substantial margin the number of testing lines that the tester has available to make a connection.

2. Description of the Prior Art

Reference is made to the following prior art patents.

U.S. Pat. No. 3,787,670 entitled "Automatic Diagnostic System" granted Jan. 22, 1974 to Paul E. Nelson et al. The ABSTRACT of the Nelson et al patent reads as follows:

"In a computer having a peripheral device and a central processor including a memory and an arithmetic unit, an anticipatory diagnositc system including a plurality of monitor units for observing operation of a peripheral device, gating means for selecting the monitor unit whose output is to be interrogated, means responsive to the gating means for quantizing the output of the selected monitor unit and means for storing the quantized output for redelivery to the central processor upon a subsequent command."

U.S. Pat. No. 3,848,188 entitled "Multiplexor Control System For A Multi-Array Test Probe Assembly" granted Nov. 12, 1974 to Frank J. Ardezzone et al. The ABSTRACT of the Nelson Ardezzone et al patent reads as follows:

"The multiplexer control system for a multi-array test probe assembly for controlling the simultaneous interface contact of the probe arrays with a plurality of electronic devices and the successive interconnection of said arrays with electronic test equipment."

U.S. Pat. No. 3,922,537, entitled "Multiplex Device For Automatic Test Equipment" granted Nov. 25, 1975 to Phillip C. Jackson. The ABSTRACT of the Jackson patent reads as follows:

"The present invention pertains to multiplex apparatus for an automatic computerized diagnostic testing system for selectively interconnecting peripheral measurement and stimulus devices to a unit under test (UUT) through various switching subsystems which differ in switching capability, load carrying ability, frequency bandwidth, and mode of operation. The multiplexer includes plural conducting means between each pin of the circuit under test and corresponding terminals or test points of plural switching sub-systems used to interconnect UUT pins and the peripheral testing devices. Each plural conducting means includes controllable switch means. These switch means operate automatically under programmed computer control. One of the switching subsystems has high frequency signal carrying ability, and the conducting means associated with this subsystem preferably include impedance matching buffers, and have a frequency bandwidth equal to that of the subsystem."

U.S. Pat. No. 4,015,200, entitled "Multiconductor Cable Testing Apparatus" granted Mar. 29, 1977 to M. T. Strandh. The ABSTRACT of the Strandh patent reads as follows:

"Multiconductor cable testing apparatus for sequentially testing the conductors of an electric cable for open-circuit, short-circuit and for incorrect connection, the results of the tests being visually displayed so that the actual fault and the conductor or conductors involved can be easily determined."

U.S. Pat. No. 4,023,097 entitled "Noise and Dielectric Absorption Compensation Circuit" granted May 10, 1977 to Richard E. Hanashey. The ABSTRACT of the Hanashey patent reads as follows:

"The following specification discloses a current noise and dielectric absorption kickback compensation circuit for a force line and a sense line that are to be initially compensated with regard to unwanted currents therein. The lines are placed in a shielded cable and mutually receive the same external noise signals. The unwanted currents are incurred in the force line and the sense line which is connected to a device under test, such as an integrated circuit, that is to have a particular voltage forced thereon and a determination made or sensed as to the current drain thereof. The force and sense lines can be initially connected to a tester which is controlled by a computer. The lines lead to the device under test through various lines interconnected by relay matrices which provide a number of different functions for testing the device under test, such as timed events, voltages, and external active or passive elements used cooperatively with the device under test and the other pins thereof. The invention compensates for spurious signals which are mutually incurred on the force and sense lines through dielectric absorption kickback and noise generated thereon, such as sixty cycle ambient noise. The compensation is effectuated by the sense line being clear of any driven signals thereon. This allows the provision of any spurious currents thereon to an amplifier having a zero reference point. The foregoing amplifier of the sense line has its output connected to an inverted reference to the input of a force line amplifier. This places the spurious respective currents on the force and sense lines in diametrically opposed equal values for purposes of providing a null on the two respective lines, inasmuch as they both receive the same approximate dielectric and noise factors. The nulling effect compensates for noise, and dielectric absorption kickback that is caused by the switching matrices and the ambient noise, so that a true current reading on the force line can take place as to any current thereon that relates to the device under test."

U.S. Pat. No. 4,034,287 entitled "General Purpose Digital Logic Monitor" granted July 5, 1977 to Flavio M. Manduley. The ABSTRACT of the Manduley patent reads as follows:

"For servicing digital logic circuits, a hand-held monitor can be connected to an indefinite number of different sets of test points. Numerical and binary displays indicate the current state of the selected test points. To help the user understand what is being monitored, removable cards can be mounted adjacent the displays. Each of the cards has printed information relating to a different set of test points. An operator-controlled auxiliary clock is included to permit the operator to step the circuit being monitored through its operating sequence."

U.S. Pat. No. 4,044,244 entitled "Automatic Tester for Complex Semiconductor Components Including Combinations of Logic, Memory and Analog Devices and Processes of Testing Thereof" granted Aug. 23, 1977 to Steven H. Foreman et al. The ABSTRACT of the Foreman et al patent reads as follows:

"Logic and analog functions in a complex semiconductor component are stuck fault and parametrically tested through an analog/digital measurement adapter coupled to logic and analog testers. Both logic and analog testers are under computer control whose purpose is to direct the testing sequence, log test results, perform algorithmic calculations on the data and diagnose failing devices in te component under test. The adapter provides the electrical environment to match a range of components under test to the logic and analog testers. The adapter is also under computer control to permit impedance matching of a multiplicity of digitally controlled stimulus/response units connected through a multiplexer to the range of components under test."

U.S. Pat. No. 4,097,797 entitled "Apparatus For Testing Electrical Circuit Units Such As Printed Circuit Cards" granted June 27, 1978 to Michel Finet. The ABSTRACT of the Finet patent reads as follows:

"A system is described for testing electrical circuit units, particularly printed circuit cards having a plurality of plug-in connector terminals.

The testing system is first operated in the Generation Mode wherein it generates a reference test pattern produced from a series of test stimuli applied sequentially to a reference card, and stores the pattern in a bulk memory, the pattern being in the form of a series of words identified by the part number of the respective card and containing the test stimuli and the responses thereto from the reference card. To test a production card, the system is operated in the Test Mode, wherein the stored test pattern generated from the corresponding reference card is extracted from the bulk memory and the reference responses are compared in a GO, NO-GO testing operation with the actual responses produced when applying the same test stimuli to the production card.

The system includes a pair of flip-flops for each pin of the tested card, one flip-flop being connected to a circuit which reflects the actual response of the pin to the test stimulus during the Test Mode, and the other flip-flop being connected to a circuit which reflects the reference response to the test stimulus as determined during the Generation Mode. The flip-flop pairs are disposed in a plurality of matrix cards each accommodating all the flip-flops of a group of pins (e.g. eight matrix cards each containing the flip-flop pairs for 25 pins, when testing a 200-pin card), providing a flexible modular arrangement easily enlargeable or alterable for testing other cards."

U.S. Pat. No. 4,125,763 entitled "Automatic Tester for Microprocessor Board" granted Nov. 14, 1978 to Richard B. Drabing et al. The ABSTRACT of the Drabing et al patent reads as follows:

"An apparatus for testing circuit board systems utilizing microprocessors which includes means for selectively exericizing each terminal or pin of the board system during each step of the testing protocol. Each step of the protocol can be preselected to operate according to an automatic sequence or according to a preprogrammed manner, or the apparatus may be conditioned to receive a response from the circuit board system at a selected terminal during a selected step of the testing protocol. The testing apparatus further includes an interactive interface to permit the board system under test to control the speed and sequence of the test procedure. The testing apparatus is capable of exericising the board systems under test in a simulated environment at typically normal operating speeds so that degradation of system performance related to operational speed and other factors found in an operating environment can be analyzed."

The practice of testing integrated circuit components is of prime importance to the electronic device manufacturers so as to weed out defective units before they are assembled and used. It is desirable to test semiconductor devices while they are still part of a wafer so as to discover unsatisfactory components prior to being mounted on the next level of packaging. Similarly, it is also desirable to test further these integrated circuit units after that they have been assembled on modules, cards or boards. Only by means of repetitive testing can the quality assurance of the devices be safeguarded. This continuous testing at each level of packaging imposes demands on the electronic industry to design and provide equipment that is capable of performing these tests in an automatic mode, at high speeds and with precise accuracy.

The trend of the electronic industry developments is to further increase the degree of miniaturization of electronic devices. This implies decreasing the area of each circuit which, in turn, allows for an increase in the density of circuits. A higher circuit count permits more logic functions to be performed by the integrated unit. This trend towards miniaturization is also accompanied by a corresponding increase in the number of terminal pins. This is necessary to maintain adequate communication between the circuitry of the unit and the remainder of the assembly or machine which it is part of.

As integrated circuits become more sophisticated, the complexity of the supporting test equipment must increase correspondingly. This signifies that the number of tests that must be performed to locate all the faults increases rapidly. For example, on a simple integrated circuit of no more than a dozen circuits, at most, several tens of tests are sufficient to locate all possible failures. In today's integrated circuits, with its hundreds and soon thousands of circuits, the number of tests required is in the order of many tens of thousands to achieve the same result. Not only the software requirements to generate such test patterns are difficult but the time needed to apply them is inordinately long. A direct consequence of this trend toward miniaturization is that the test equipment must be able to process a large number of patterns at high speed. Such electronic tester is usually controlled by a computer. The tester generates a signal that is provided to the integrated circuit or assembly, hereinafter referred to interchangeably as a unit under test (UUT). This signal which is in the form of a forced voltage or current is supplied to the appropriate input terminal pin by an electronic network called "digital-to-analog converter" or "D/A converter", in short. This, and other pertinent circuitry forms a "tester channel". As the name states it, it converts a "logic binary level" into an electrical analog level which is applied to a single input terminal of the unit under test (UUT). In a similar fashion, the actual electrical response at the output pins of the UUT is compared to a standard acceptable response by the computer. These responses are dictated by the test patterns. For example, if the expected binary level at one output pin of the UUT is a "logic 1", the tester, by use of the channel connected to that output pin, will measure the voltage or current level. A nonconcurrence between the measured and expected levels indicates the presence of a failure inside of the integrated circuit, and the unit is discarded as defective.

Today, a one to one correspondence between each tester channel and a terminal pin of a UUT always exists. By presetting each tester channel to a defined level, it is possible to assign a voltage or current level appropriate to each terminal connection. The prior art, however, has not solved the problem when the tester falls behind the advances in the complexity of the semiconductor technology and when an inadequate number of tester channels are present to service the totality of terminal pins of the UUT.

In effect, this invention provides an advance over the prior art by enabling a tester with less channels than those required by the integrated circuit package to actually test this package as if an adequate number of channels were available. In particular, this invention is useful to test large scale integrated packages that represent the latest advances in technology with existing test equipment whose architecture and characteristics have not fully matched the advances in semiconductor technology packages.

SUMMARY OF THE INVENTION

To overcome many of the above-mentioned shortcomings and to provide a practical system to match a large or very large scale integrated circuit package (LSI or VLSI) with terminal pins in excess over the available number of tester channels, the present invention provides, as its primary object, a method and apparatus for connecting a plurality of input terminal pins to a single channel.

Another object of the invention is a multiplexer network to select to which tester channel a plurality of input terminal pins of the UUT are to be connected, and whereby this selection automatically changes from one integrated circuit package to the next.

Another object of the invention is a high-speed memory buffer with one memory cell per terminal pin for storing the test pattern sequence to be applied to the device under test, UUT.

Another object of the invention is a switching network that permits delivering a voltage or current level to an input terminal connection, and whereby the controlling line that allows the voltage or current to reach the input pin is determined by the logic binary value of the test pattern bit that corresponds to that input pin.

In the illustrative embodiment, the UUT is represented by a multi-chip-module (MCM) with a plurality of input and output terminals. The tester is computer controlled. The number of available tester channels is less than the number of terminals required to test the module. A program classifies all input pins in a plurality of categories, each of which corresponds to a unique circuit type and electrical network configuration. The object of this sorting process is to single out every possible electrical characteristic that affects the DC levels to be applied during testing of the module. Output terminal pins, on the other hand, are not processed by the aforementioned program.

This invention requires that each bilevel electrical signal pattern to be applied to input terminals and sensed at the output terminals in the package under test to determine whether the package is defective, be stored in a high speed memory buffer, such that there exist a one to one correspondence between a storage position and an input or output of the module under test. This invention requires furthermore that each tester channel be connected to inputs capable of driving a plurality of input pins. All members of this plurality belong to a single category of inputs, that is characterized by a unique circuit type and electrical network configuration. Such input channels are set at a fixed level capable of delivering the appropriate DC voltage to each member of the group of inputs. The selection of members of each plurality is determined by the aforementioned sorting process and is implemented in the preferred embodiment by a set of multiplexers. Each multiplexer selects 1 out of n possible DC levels that are appropriate to each input pin. Since each functional test pattern consists of a sequence of logic "0"s and "1"s, there exists one DC level for each state that is appropriate to a plurality of inputs. This invention requires furthermore that each output of the UUT be assigned its own tester channel. This is necessary to allow a comparison between the measured DC level and the expected level as defined by the test pattern. The channel selection for the outputs of the UUT is controlled by the multiplexer that inhibits its other inputs from interfering with the channel selected for connection to that output.

The theoretical limitation of this invention is testing a complex MCM of k outputs and p input pins divided in m classes, where p>>m,(e.g., p much larger than m) on a tester of no less than 2 m+k channels.

The testing system of the present invention, as briefly described above, provides an important advantage in that integrated circuit packages whose terminal pins exceed the number of available channels may be tested without havichannels.

The testing system of the present invention, as briefly described above, provides an important advantage in that integrated circuit packages whose terminal pins exceed the number of available channels may be tested without having to resort to a tester with a higher number of channels.

BRIEF DESCRIPTION OF THE DRAWINGS

The invention will be more clearly understood by reference to the description below taken in conjunction with the accompanying drawings wherein.

DESCRIPTION OF THE PREFERRED EMBODIMENT

In order to afford a complete understanding of the invention and an appreciation of its advantages, a preferred embodiment is presented below in the context of a practical environment.

Figure 1:
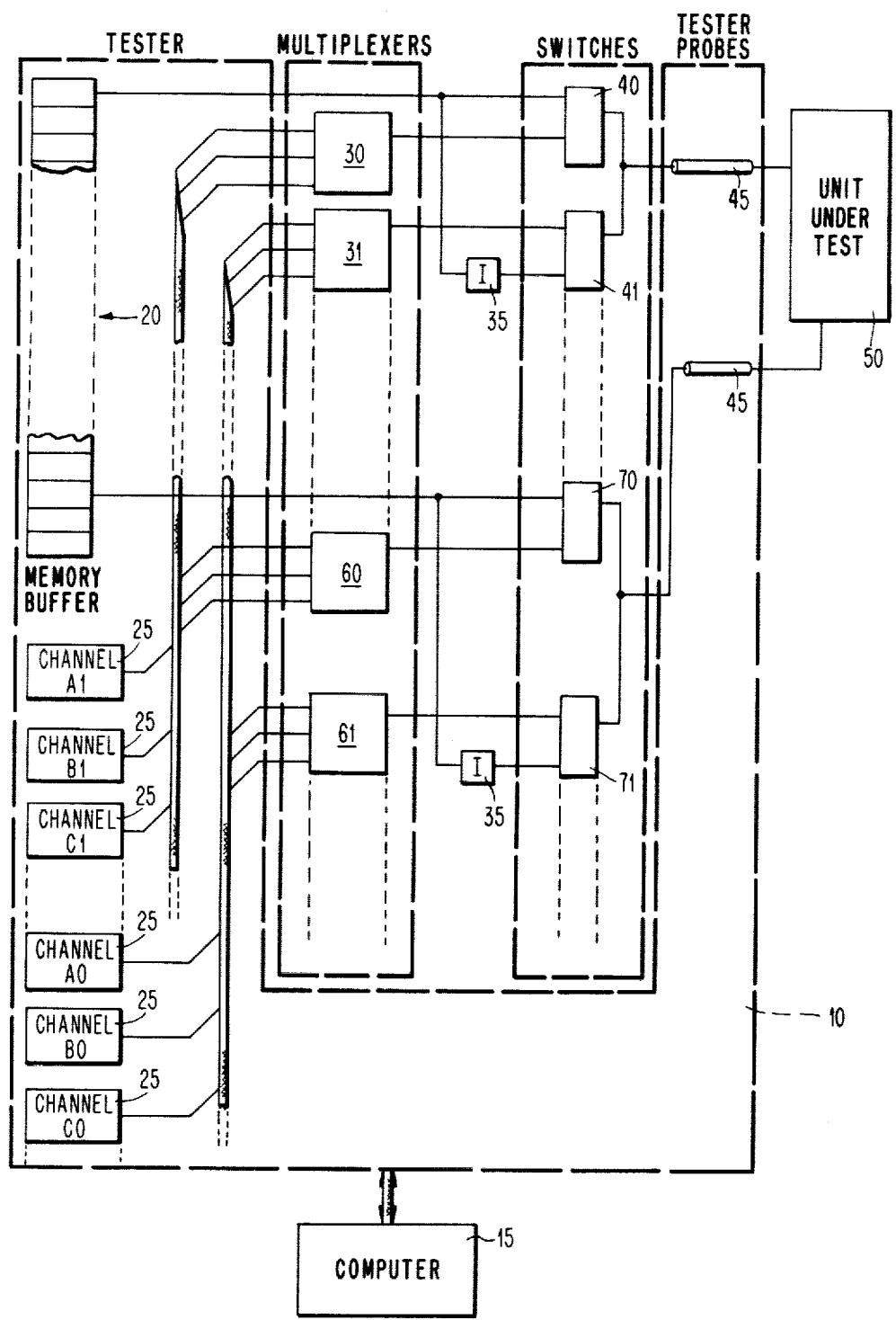
FIG. 1 is a simplified block diagram of the present invention diagrammatically illustrating the connections between each tester channel and a plurality of terminals of a module under test.

Referring first to FIG. 1, the apparatus is a tester 10 of which only the tester channels 25 are shown. The tests to be performed and the interrogation related to the results of the tests, are provided by a general computer 15. This computer has a pre-established memory incorporated therewith for purposes of providing a test to the integrated circuit unit under test (UUT). The computer, in this particular instance, also controls a high-speed memory buffer 20 with as many memory cells or memory positions as there are input/output terminal pins at the UUT 50. Test patterns are stored in this memory buffer, one test sequence at a time.

Figure 2:
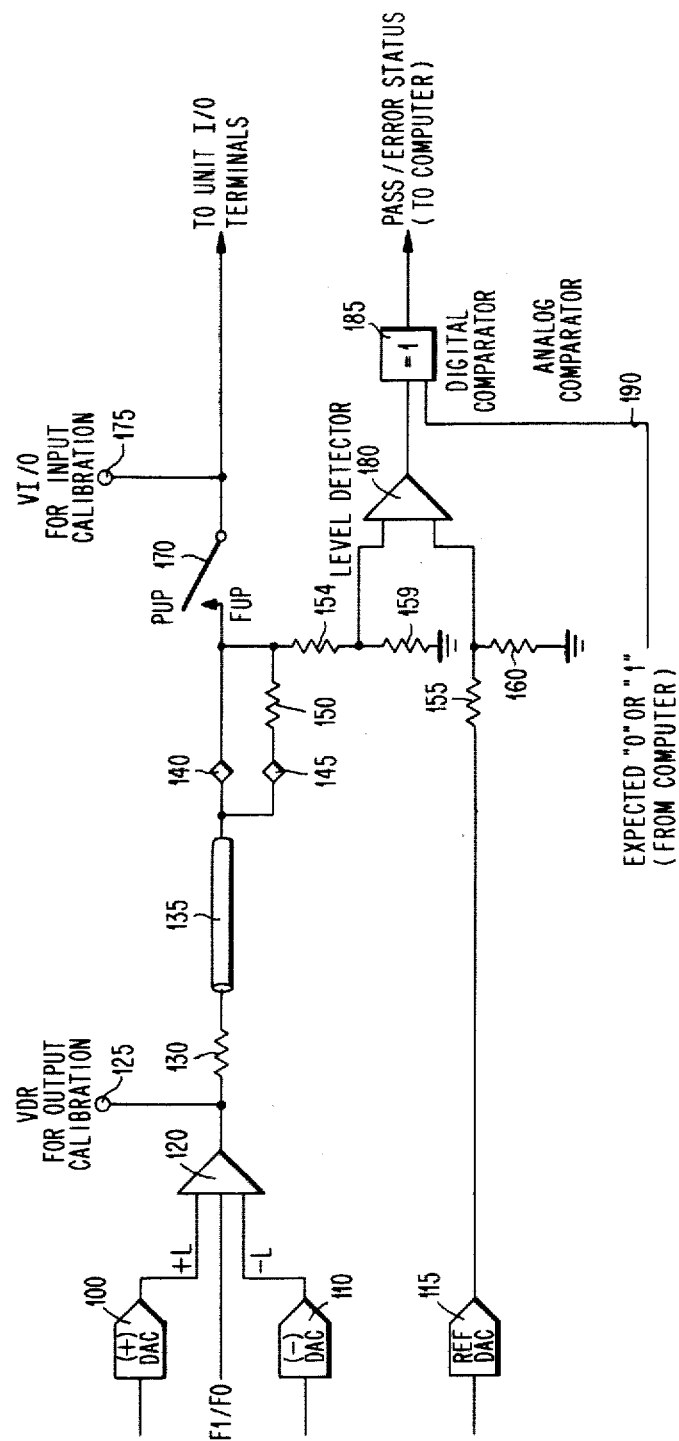
FIG. 2 is a detailed schematic diagram of the switching circuitry according to this invention.
Figure 3:
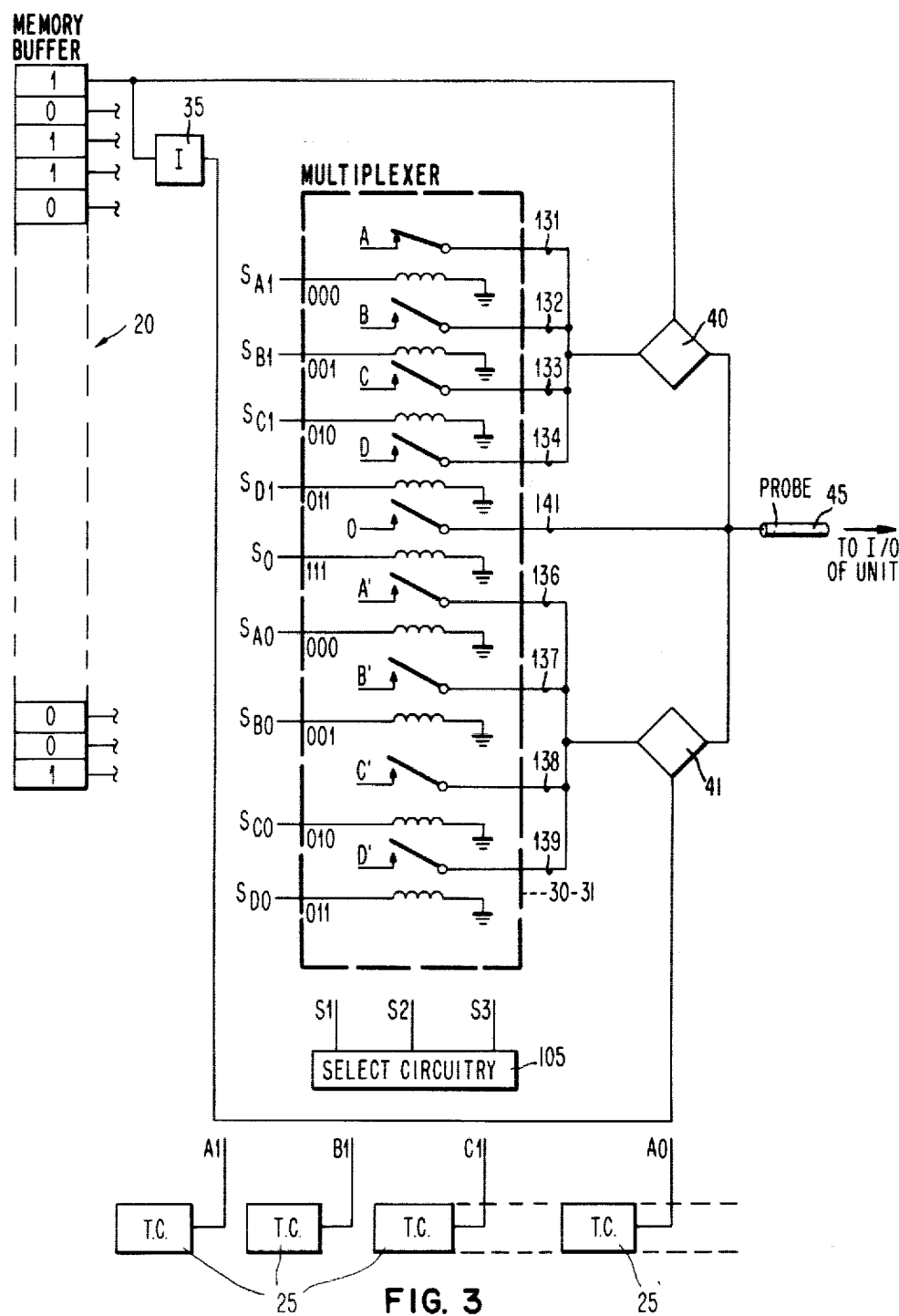
FIG. 3 is a detailed electrical schematic of a tester channel to be used as input to the multiplexers of FIG. 2.
Figure 4A:
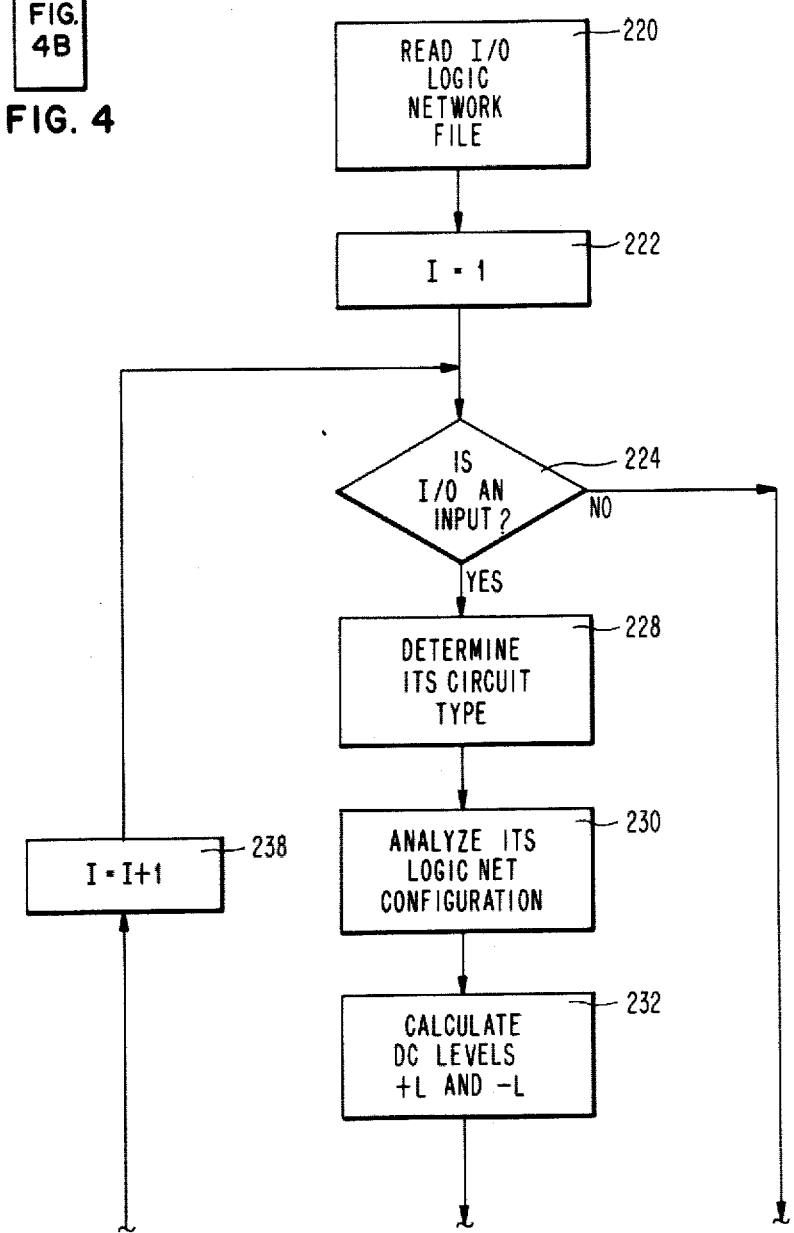
FIG. 4, a composite of FIGS. 4A and 4B, is a flow chart of a routine that sorts all input terminals into a plurality of classes as a function of the circuit types and electrical nets associated to each terminal pin.
Figure 4B:
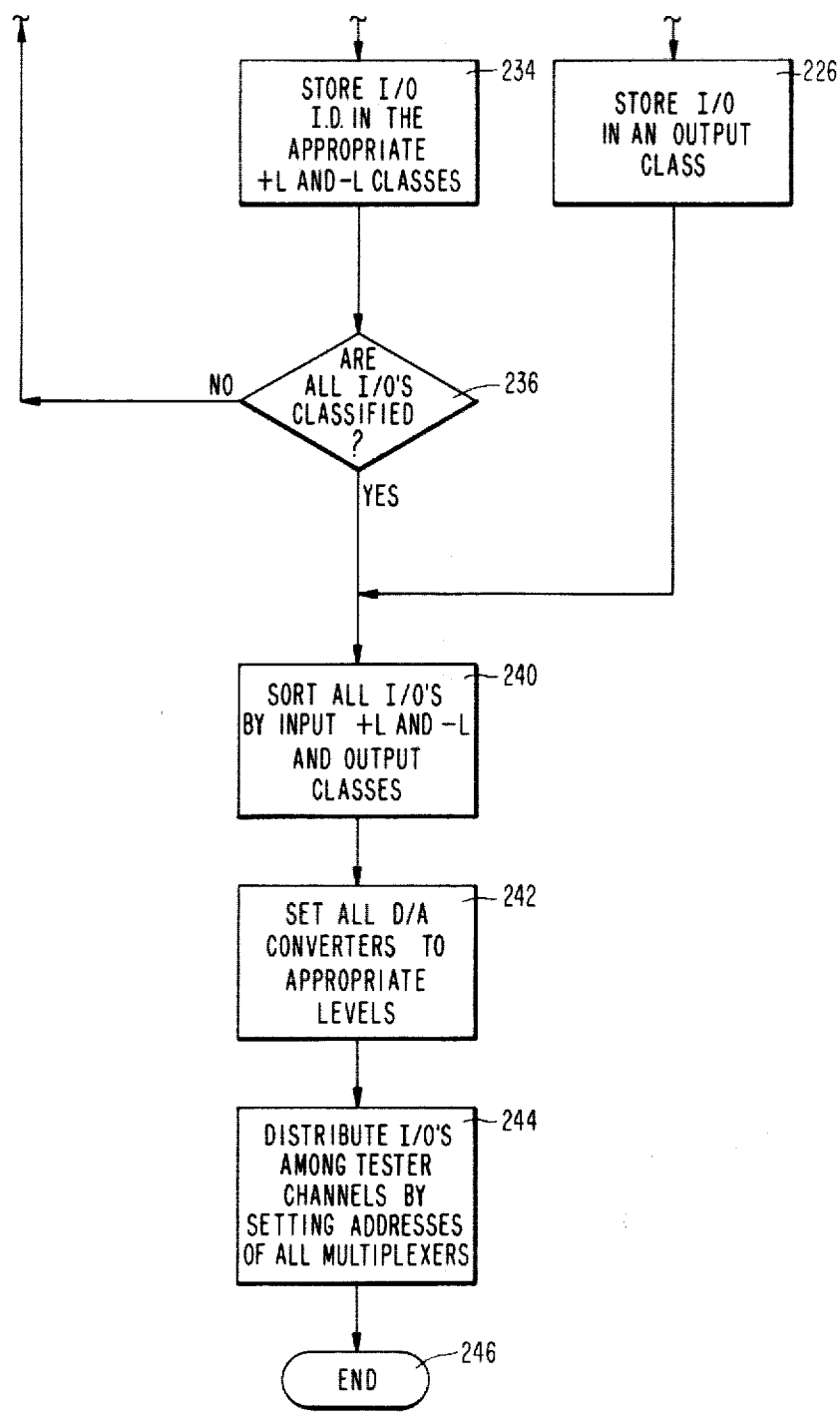

Tester channels 25 are assigned to several classes according to a sorting scheme illustrated in FIG. 4. These tester channels, also represented in more detail in FIG. 2, are connected to a plurality of multiplexers 30, 31, ..., 60, 61. Each pair of multiplexers has its inputs connected to a multitude of channels, each of which represents a separate category, with an additional multiplexer input connected to a single independent channel to service an output terminal of the UUT. All inputs to the first multiplexer of each pair have their digital-to-analog converters set at a single level that represents the logic 1 condition of a particular class. Similarly, all inputs to the second multiplexer of each pair have their digital-to-analog converters set at the 0 logic level of that class. For each input or output terminal, there exists a pair of multiplexers, or a single multiplexer, if the schematic diagram of FIG. 3 is used. At any one time, only one of the two multiplexers is operational. If the pattern bit corresponding to the module pin k is a 1, then switching circuit 40 will be ON, whereas switching circuit 41 preceded by a logic NOT circuit 35 will be OFF. Furthermore, the multiplexers of pin k will already have been preset to some defined level, depending on the class input k belongs to. The outputs of multiplexers 30 and 31 are, therefore, at some voltage or current level +L and −L, respectively, that are characteristic of all inputs of that class. At the tester probe 45, either +L or −L will be present, depending on the bit content of the particular test pattern.

FIG. 2 illustrates a tester channel represented in FIG. 1 by channels 25. A digital-to-analog converter outputs a level that approximately defines a logic 1. This level +L is set higher than −L. The precise value of −L is not relevant. The line F1/F0 is the output of a switch that is set in this present example to F1, i.e. Force 1. The output of driver 120 is connected to a resistor 130. Resistor 130 is, in turn, connected to a cable 135 which ties two solid-state switches 140 and 145, depending whether a 90 ohm or a 750 ohm combination is desired. Switch 170 permits selecting a functional driver (FUP) or a parametric driver (PUP) to the UUT terminal. When the tester channel is used as an input, calibration to the level +L is done at point 175, whereas, when it is used as an output, auto-calibration is effected at point 125. When the tester channel is used for an output, the reference digital-to-analog converter 115 is set to an appropriate reference level. The combination of resistors 130–150, in conjunction with the existing voltage VDR at point 125 provides a Thevenin's equivalent resistance and voltage that acts as a load to the UUT output pin. The measured level under the aforementioned loading conditions is compared with the preset reference level. Both inputs to driver 180 are appropriately attenuated by means of the resistor dividers 154–159 and 155–160, respectively. Any voltage above the reference voltage returns a logic 1 at the output of driver 180, whereas a voltage below Vreference returns a logic 0. This binary level is compared with the expected binary level of the appropriate bit of the test pattern. A logic discrepancy is recorded as an error.

During operation, a plurality of terminal pins are connected to one channel. Each test pattern forces either a 0 or 1 to every input pin. Since the voltage levels corresponding to a 0 and a 1 are fixed once the channel assignments have been made for a UUT, whether level −L or +L is selected will depend on the 0/1 bit configuration of the test patterns. Those bits will open or close the solid state switches labeled 40 and 41, (FIG. 3) thus allowing either channel A1, ..., or A0, ..., to be connected to the input pin.

FIG. 3 illustrates a more detailed view of the multiplexer circuit configuration. The pair of multiplexers 30-31 referred to in FIG. 1 is shown as a single electrical circuit. Each input A1, B1, C1 and D1 represents a different +L level, whereas A0, B0, C0 and D0 represents the equivalent counter level −L. Input O is added for the case when the UUT terminal associated with the multiplexer is an output. A selector circuit 105 automatically selects which inputs A1, ..., D1 and A0, ... D0 or O are to be connected to the UUT terminal. The computer 15 of FIG. 1 analyzes the input/output terminal configuration, classifies the terminal pins in several classes and assigns a plurality of input terminals to each tester channel by means of selector circuit 105. The computer also takes into consideration the loading limitations of each tester channel. Further limitations will be described hereinafter. If the terminal is an output, relays 131-134 and 136-139 remain open, whereas 141 is closed. A tester channel will then be uniquely connected to the terminal.

FIG. 4 illustrates the routine that sorts all input terminals into a plurality of classes. Each class uniquely defines a type and electrical net configuration of the input circuitry tied to the input. Typically, this sorting routine is exercised once per module part number and is run independently from the testing activities.

In the embodiment of the invention illustrated in the drawings, a description file of the electrical networks of all input/output pins as shown by block 220 in FIG. 4 is read. Each terminal is analyzed, one at a time, to determine first if it is an input or an output (block 222). If it is an output, the name of the pin is stored in a class by itself. All members of this output class will be assigned each their own tester channel. If the terminal is identified as an input, the program interrogates further to ascertain its circuit type or "pin type" (block 228). Further analysis identifies the nature and number of electrical loads and other circuits that are tied to that net (block 230). Finally, the levels +L and −L are calculated as a function of the pin type (block 232) and I/O electrical network and stored in their appropriate class (block 234). This process is repeated for each terminal pin (blocks 236 and 238) until all I/O's have been classified. Upon completion of this iterative process, the following classes have been populated (block 240): an output class, and a plurality of input categories, subdivided in two subclasses: a $+L$ level and a $-L$ level sub-class. The computer proceeds then to set all digital-to-analog converters to their appropriate levels (block 242), and the select circuitry of each multiplexer is set to assign the channels to the input pins (block 244). This assignment completed, the program comes to an end (block 246).

The limitation of the method described in this invention was briefly mentioned above. A module part number of k outputs, p inputs divided into m classes, where $p >> m$, (e.g., p very much larger than m) requires a tester of at least $2m + k$ channels. Of these 2 m, m are assigned to the $+L$ levels and m are assigned to the $-L$ levels. There exists, furthermore, another limitation that relates to loading down a tester channel when too many input terminals are connected to it. Under such circumstances, it becomes unfeasible for a channel to deliver the expected voltage to all the terminals it is connected to. This limitation is not a severe constraint, because several channels may usually be assigned to each particular class of inputs.

A statistical analysis of various technologies has shown that there exists a limited set of "0" and "1" DC levels that are to be applied to inputs of the unit under test, perhaps as few as 6 and as many as 15. Such statistical analysis forms no part of my invention.

With this information, semiconductor packages that exceed the number of available tester channels may be tested without having to resort to a tester with a higher number of channels.

While the invention has been shown and particularly described with reference to a preferred embodiment, it will be understood by those skilled in the art that various changes in form and detail may be made without departing from the spirit and scope of the invention.

I claim:

1. An apparatus for testing large or very large integrated circuit packages, said apparatus including: a stored program computer; a tester interconnected with said computer said tester including, a memory buffer having m binary outputs, n tester channels, a plurality of multiplexer circuits connected to said n tester channels, a plurality of tester probes for contacting input and output contacts of a unit under test (UUT), and a plurality of solid state switches interconnecting said memory buffer, said plurality of multiplexer circuits and said plurality of test probes; and, said apparatus being characterized by the ability to effectively test a unit under test having a greater number of inputs and outputs than said n tester channels.

2. A test system for testing integrated circuit devices having m Input/Output terminals, said system including: a program controlled computer; a tester having n test channels, where m is an integer greater than n; an m bit memory buffer; and computer controlled switching network means interconnecting said computer, said n test channels, said m bit memory buffer and a device under test having m Input/Output terminals; said test system being characterized in that said test system having only n test channels effectively tests a device under test having m Input/Output terminals.

3. A test system for testing integrated circuit devices, as recited in claim 2, wherein said computer controlled switching network means includes interconnected multiplexer means and solid-state switching circuit means.

4. In a computer controlled high speed electronic test system, an improved tester, said tester comprising: a memory buffer having a capacity of at least m bits; a plurality of solid state switches connected between said memory buffer and a device under test having m input/output terminals; a plurality of multiplex circuits connected to said solid state switches; n test channels connected to said plurality of multiplexer circuits, where m is an integer greater than n, whereby a device under test having m input/output terminals may be effectively tested by a tester having only n test channels.

5. In a computer controlled high speed electronic test system, an improved tester, as claimed in claim 4, wherein a computer utilizing a computer program classifies said input terminals of said m input/output terminals of said device under test into classes wherein each member of a class has like electrical requirements and each input of a class is connected via a certain one of said solid state switches and a certain one of said multiplexer circuits to a single one of said test channels.

* * * * *